United States Patent
Syzdek

(10) Patent No.: US 7,843,730 B2
(45) Date of Patent: Nov. 30, 2010

(54) NON-VOLATILE MEMORY WITH REDUCED CHARGE FLUENCE

(75) Inventor: Ronald J. Syzdek, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 365 days.

(21) Appl. No.: 12/015,247

(22) Filed: Jan. 16, 2008

(65) Prior Publication Data

US 2009/0180334 A1 Jul. 16, 2009

(51) Int. Cl.
*G11C 16/04* (2006.01)
*G11C 16/06* (2006.01)
*G11C 5/06* (2006.01)

(52) U.S. Cl. ............... 365/185.05; 365/185.24; 365/185.29; 365/185.18

(58) Field of Classification Search .......... 365/185.24, 365/185.29, 185.05, 185.18
See application file for complete search history.

(56) References Cited

U.S. PATENT DOCUMENTS

| 4,758,988 | A | 7/1988 | Kuo |
| 5,367,484 | A | 11/1994 | Alexander et al. |
| 5,926,416 | A | 7/1999 | Beverina et al. |
| 6,081,447 | A | 6/2000 | Lofgren et al. |
| 6,363,014 | B1 | 3/2002 | Fastow |
| 7,130,223 | B2 | 10/2006 | Ishimaru et al. |
| 7,133,313 | B2 | 11/2006 | Shih |
| 7,167,392 | B1 | 1/2007 | Poplevine et al. |
| 7,170,795 | B2 | 1/2007 | Lee |
| 7,209,387 | B2 | 4/2007 | Yip |
| 7,215,577 | B2 | 5/2007 | Liu et al. |
| 2002/0028541 | A1* | 3/2002 | Lee et al. ............ 438/149 |
| 2002/0118570 | A1* | 8/2002 | Iijima ............ 365/185.18 |
| 2007/0053222 | A1 | 3/2007 | Niset et al. |
| 2007/0064482 | A1* | 3/2007 | Takeuchi ............ 365/185.03 |

OTHER PUBLICATIONS

PCT/US2009/300080 International Search Report and Written Opinion.

* cited by examiner

*Primary Examiner*—J. H. Hur
(74) *Attorney, Agent, or Firm*—Kim-Marie Vo; James L. Clingan, Jr.

(57) ABSTRACT

A method including performing a program/erase cycle on a first non-volatile memory (NVM) bit of an integrated circuit using a first fluence, wherein the first NVM bit has a first transconductance is provided. The method further includes performing a program/erase cycle on a second NVM bit of the integrated circuit using a second fluence, wherein the second NVM bit has a second transconductance, and wherein the first transconductance is greater than the second transconductance and the second fluence is greater than the first fluence.

20 Claims, 4 Drawing Sheets

NON-VOLATILE MEMORY WITH REDUCED CHARGE FLUENCE

BACKGROUND

1. Field

This disclosure relates generally to a non-volatile memory, and more specifically, to a non-volatile memory with reduced charge fluence.

2. Related Art

Thin film storage non-volatile memory arrays suffer from charge trap-up problem. In particular, repeated write/erase cycles result in electrons getting trapped in the dielectric layers of the thin film storage cells. This is because each time a memory cell is erased and programmed, electrons are tunneled to and from a floating gate of the memory cell. Some of the electrons while being tunneled get trapped in the dielectric layers of the floating gate. Trapped electrons reduce the write/erase endurance of the non-volatile memory. The number of electrons that get trapped is a function of the threshold voltage window, i.e., the difference between the threshold voltage of the memory cell in the programmed state and the threshold voltage of the memory cell in the erased state. Conventional non-volatile memories have a large threshold voltage window resulting in a larger number of electrons getting trapped in the dielectric layers of the thin film storage cells corresponding to these non-volatile memories. As explained above, this reduces the write/erase endurance of such non-volatile memories.

Accordingly, there is a need for a non-volatile memory with reduced charge fluence.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
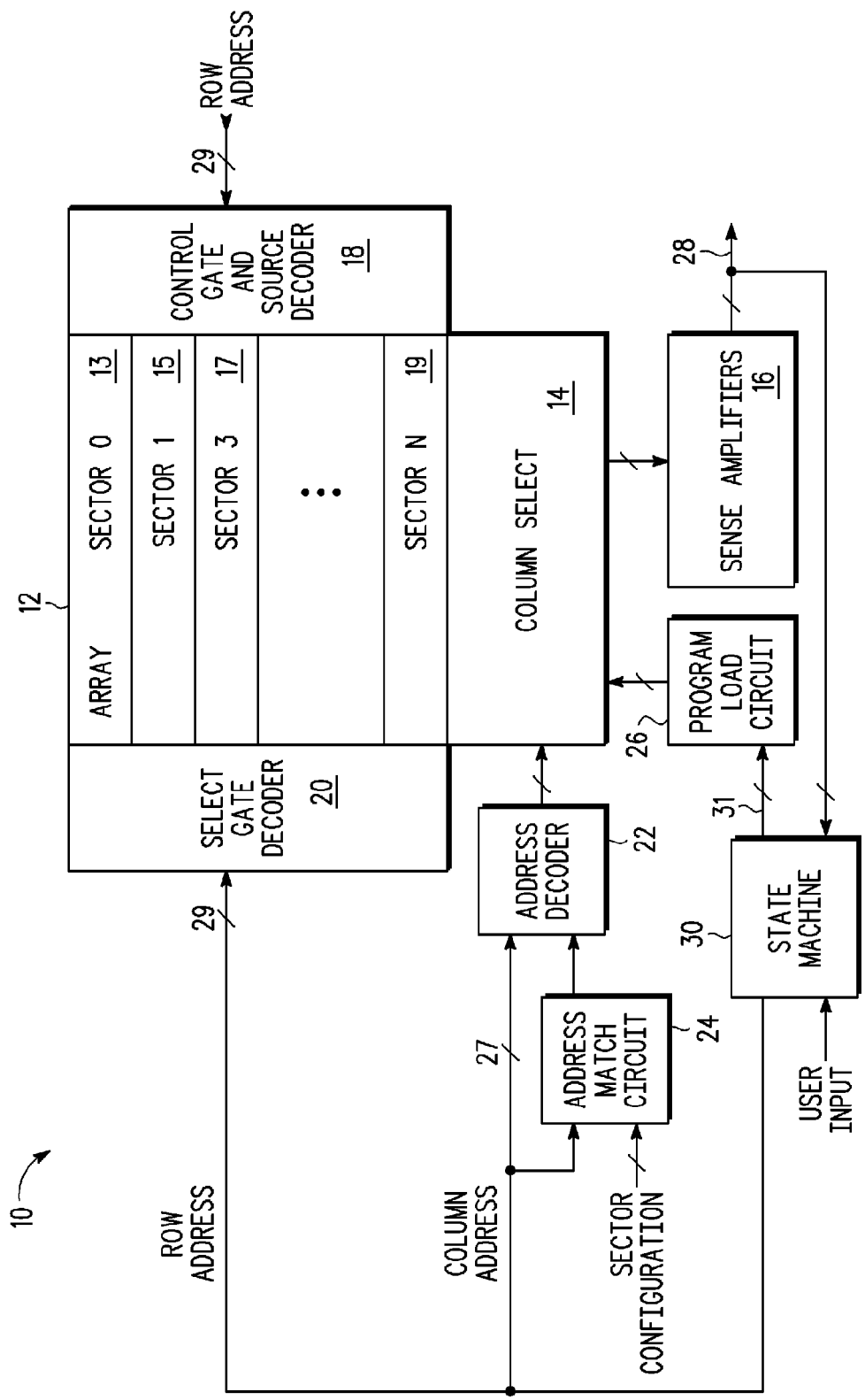
FIG. 1 shows a block diagram of an exemplary non-volatile memory.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By way of example, two different non-volatile memory cells having different desirable characteristics are characterized as having different transconductances. A program/erase cycle is performed on a first non-volatile memory (NVM) bit of an integrated circuit using a first fluence. The first NVM bit has a first transconductance. A program/erase cycle on a second NVM bit of the integrated circuit is performed using a second fluence. As used herein the term fluence refers to the number of electrons or holes that intersect a unit area, or any other measure of a rate of flow of electrons or holes across a unit area. The second NVM bit has a second transconductance. The first transconductance is greater than the second transconductance. The second fluence is greater than the first fluence. The result is that there is less trap-up in the higher conductance first NVM bit and thus the first NVM bit has higher endurance. The lower endurance second NVM bit will be expected to be smaller and thus less expensive due to having the lower transconductance.

In one aspect, a method including performing a program/erase cycle on a first non-volatile memory (NVM) bit of an integrated circuit using a first fluence, wherein the first NVM bit has a first transconductance is provided. The method further includes performing a program/erase cycle on a second NVM bit of the integrated circuit using a second fluence, wherein the second NVM bit has a second transconductance, and wherein the first transconductance is greater than the second transconductance and the second fluence is greater than the first fluence.

In another aspect, a memory including a first non-volatile memory (NVM) bit having a first transconductance is provided. The memory further includes a second NVM bit having a second transconductance less than the first transconductance. The memory further includes a program/erase circuit coupled to the first and second NVM bits that performs a program/erase cycle using a first fluence on the first NVM bit and a second fluence on the second NVM bit, wherein the first fluence is less than the second fluence.

In yet another aspect, a memory including a first non-volatile memory (NVM) bit having a first transconductance is provided. The memory further includes a second NVM bit having a second transconductance less than the first transconductance. The memory further includes means for performing an event on each of the first and second NVM bits wherein the event comprises one of a group consisting of program and erase and wherein the event causes more trap up in the second NVM bit than the first NVM bit.

FIG. 1 shows a block diagram of an exemplary non-volatile memory 10. Non-volatile memory 10 may include a memory array 12, a column select 14, sense amplifiers 16, a control gate and source decoder 18, a select gate decoder 20, an address decoder 22, an address match circuit 24, a program load circuit 26, and a state machine 30. Memory array 12 may include memory bitcells, which may further be organized in sectors, such as SECTOR 0 13, SECTOR 1 15, SECTOR 2 17, and SECTOR N 19. Any other device, such as a processor, accessing non-volatile memory 10 may place an address on column address bus 27 and row address bus 29. Non-volatile memory 10 may be a stand alone memory or may be included on the same integrated circuit as the microcontroller. In one embodiment, non-volatile memory 10 may include thin film storage memory cells. Thin film storage memory cells may include a charge storage layer, such as a nanocrystal layer, sandwiched between two dielectric layers. State machine 30 may control various aspects of reading, programming, and erasing the memory cells of memory array 12. For example, in response to USER INPUT, state machine 30 may provide row address and column address to non-volatile memory 10. In response to the SECTOR CONFIGURATION signal, address match circuit 24 may direct column select 14 to couple only one of the bitlines comprising memory array 12 to sense amplifiers 16.

In one embodiment, non-volatile memory 10 may function in a conventional manner, except that in certain instances, by manipulating address control logic (address decoder 22 and column select 14, for example), multiple memory cells may be read in parallel. In other words, in lieu of a single cell NOR architecture, four cell parallel architecture may be used. By way of example, address match circuit 24 may receive a SECTOR CONFIGURATION signal, which may provide information to address match circuit 24 as to which memory cells may be read in parallel. SECTOR CONFIGURATION signal may be set at the time of the design/manufacture of the non-volatile memory or may be programmed by a user of the non-volatile memory. Upon receiving an address corresponding to a read operation, address match circuit 24 may compare the received address to the addresses corresponding to those sectors that have been configured as having memory cells that could be read in parallel. If there is a match, address match circuit 24 may provide appropriate control signals to address decoder 22 to enable reading of multiple memory cells in parallel.

Figure 2:
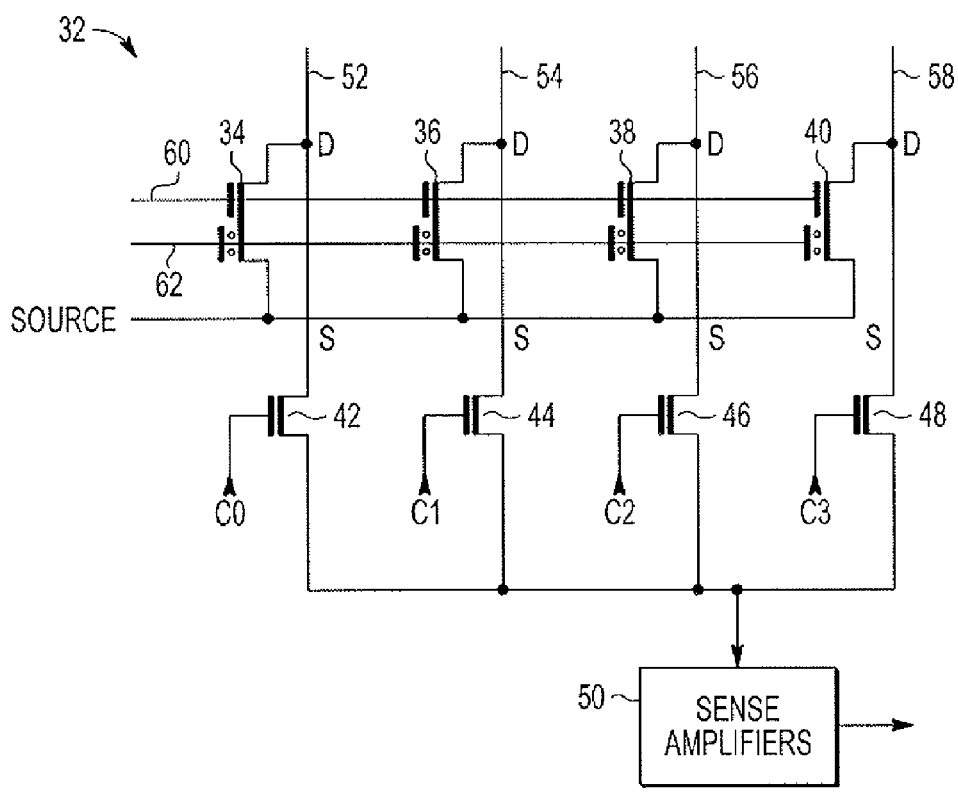
FIG. 2 shows a diagram of a portion of the exemplary non-volatile memory of FIG. 1.

FIG. 2 shows a diagram of a portion 32 of the exemplary non-volatile memory 10 of FIG. 1. Portion 32 may include a plurality of non-volatile memory cells, such as non-volatile memory cells 34, 36, 38, and 40. Each of these non-volatile memory cells may be coupled to bitlines, such as bitlines 52, 54, 56, and 58. Each of the non-volatile memory cells may further be coupled to a select gate line 60 and control gate line 62. The source terminals of non-volatile memory cells 34, 36, 38, and 40 may be coupled to a line labeled SOURCE. Assertion of a signal on select gate line 60 would couple each of non-volatile memory cells 34, 36, 38, and 40 to their respective bitlines. For read operation, control gate line 62 may be maintained at a bias voltage appropriate for the read operation. For erase/program operation, the selected control gate may be brought to a high potential suitable for erasing or programming. By selective assertion of signals on column select lines C0, C1, C2, and C3, any of the transistors 42, 44, 46, and 48 may be turned on. If for example, transistors 42 and 44 are turned on, then bitlines 52 and 54 may be coupled together. If for example, transistors 42, 44, 46, and 48 are turned on, then bitlines 52, 54, 56, and 58 may be coupled together connecting the drains of non-volatile memory cells 52, 54, 56, and 58. The signal on the coupled bitlines may be sensed by sense amplifier 50 in a conventional manner to detect whether the non-volatile memory cell or cells being sensed are in a programmed state or an erased state. When bitlines corresponding to a plurality of non-volatile memory cells are coupled together as shown in FIG. 2, the threshold voltage required to read the memory cells is increased, which in turn reduces the threshold window (the delta between the program voltage and the erase voltage) and hence improves the endurance of these memory cells. Although FIG. 2 shows an embodiment in which the drains of transistors are coupled selectively, they may be permanently coupled. Moreover, although FIG. 2 shows an implementation in which four columns are coupled, additional or fewer columns may be coupled. Additionally, although FIG. 2 shows a column-wise coupled implementation of a non-volatile memory, the non-volatile memory may be implemented in a row-wise manner. As part of a row-wise implementation, four rows may be coupled in parallel using a row-select signal (not shown) thereby coupling four rows in parallel, instead of coupling four columns in parallel.

Figure 3:
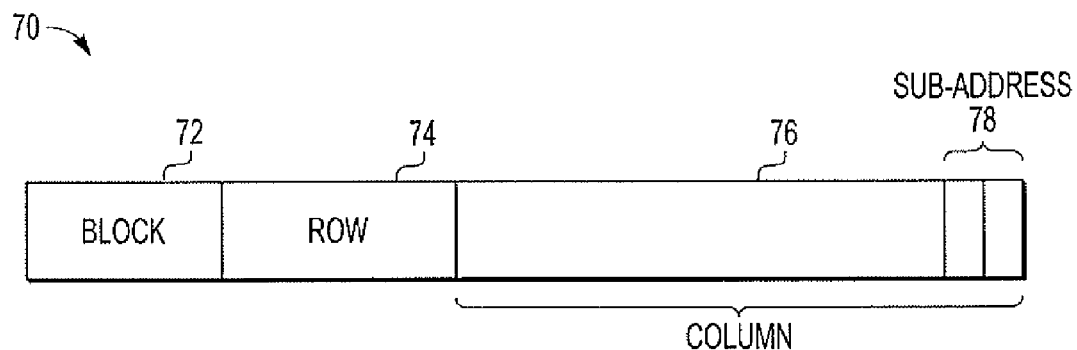
FIG. 3 shows a diagram of an exemplary addressing scheme for the exemplary non-volatile memory of FIG. 1.

FIG. 3 shows a diagram of an exemplary addressing scheme 70 for the exemplary non-volatile memory 10 of FIG. 1. Each non-volatile memory cell may be addressed using the addressing scheme shown in FIG. 3. Block 72 may provide the block address of the non-volatile memory cell to control gate and source decoder 18 and select gate decoder 20. In one embodiment, block 72 address may correspond to the higher order row address bits. Row 74 may provide the row address of the non-volatile memory cell to control gate and source decoder 18 and select gate decoder 20. Column 76 may provide the column address to address decoder 22. Column 76 may further include sub-address 78, which may indicate to address decoder 22, which, if any, bitlines are to be coupled together for reading purposes. For example, information stored in the sub-address field may be used by column select 14 to assert appropriate signals on column select lines, for example C0, C1, C2, and C3. Although not shown in FIG. 3, if a row-wise implementation is used then addressing scheme 70 may include a sub-address field including information concerning which row-select signals should be asserted.

Figure 4:
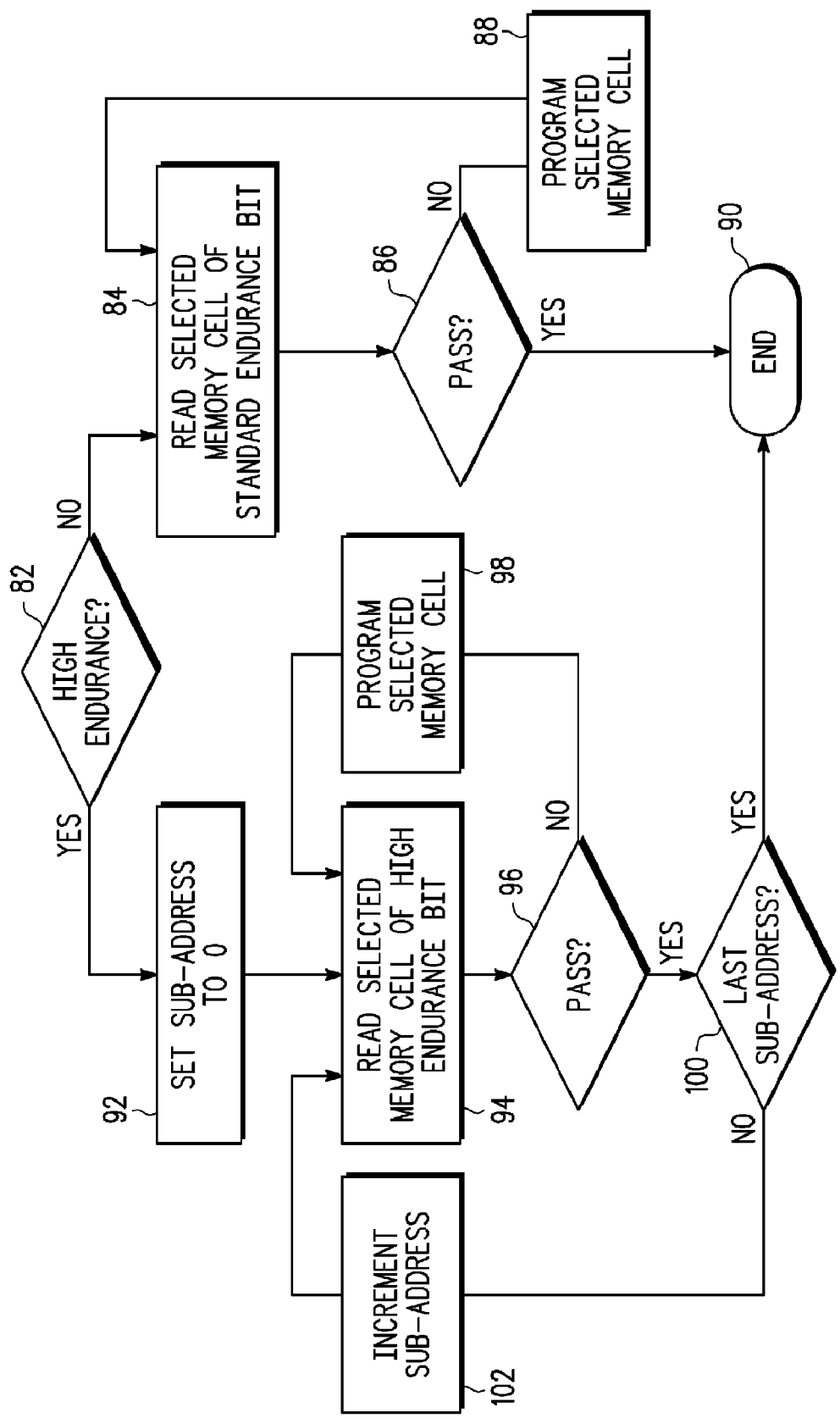
FIG. 4 shows a flow chart for an exemplary method for accessing the non-volatile memory of FIG. 1.

FIG. 4 shows a flow chart for an exemplary method for accessing non-volatile memory 10 of FIG. 1. By way of example, FIG. 4 shows a method of programming a memory cell in four steps if it is detected to be part of a high-endurance sector or programming a memory cell in one step if it is detected to be part of a non-high endurance sector. In one embodiment, a memory cell may be programmed by adding electrons to a memory storage element, such as a nanocrystal layer corresponding to the memory cell and the memory cell may be erased by removing electrons from the memory storage element, such as the nanocrystal storage layer. This flow chart may be implemented by appropriate control logic in the non-volatile memory. In one embodiment, the steps illustrated in FIG. 4 may be performed by state machine 30 of FIG. 1. In step 82, state machine 30 may determine whether a read request is for reading a high endurance bit or a standard endurance bit. If in step 82, if it is determined that the read request is not for a high endurance bit memory cell, then in step 84 state machine 30 may read selected memory cell of standard endurance bit. If the read operation results in a pass (step 86), then the process may end (step 90). If, however, the read operation results in a failure, then in step 88, state machine 30 may program selected memory cell.

Referring still to FIG. 4, if in step 82 it is determined that the read request is for a high endurance bit, then in step 92 state machine 30 may set sub-address 78 field to 0. Next, in step 94, state machine 30 may read a selected memory cell of high endurance bit. If the read operation results in a pass (step 96), then in step 100, state machine 30 may check to see whether the memory cell corresponding to last sub-address has been read or not. If, however, the read operation results in a failure, then in step 98, the selected memory cell is programmed by state machine 30. Referring back to step 100, if the last sub-address has been read, then state machine 30 may increment the value of the sub-address field by one (step 102) and the next selected memory cell of high endurance bit is read and the process continues to repeat unlit all of the selected memory cells have been read. Although FIG. 4 shows specific steps being performed in a specific sequence, state machine 30 may perform additional and/or fewer steps in a different sequence. In addition, although in FIG. 4 the steps are described as being performed by state machine 30 other blocks/circuits may also perform these steps alone or in conjunction with state machine 30 and/or other blocks/circuits.

Figure 5:
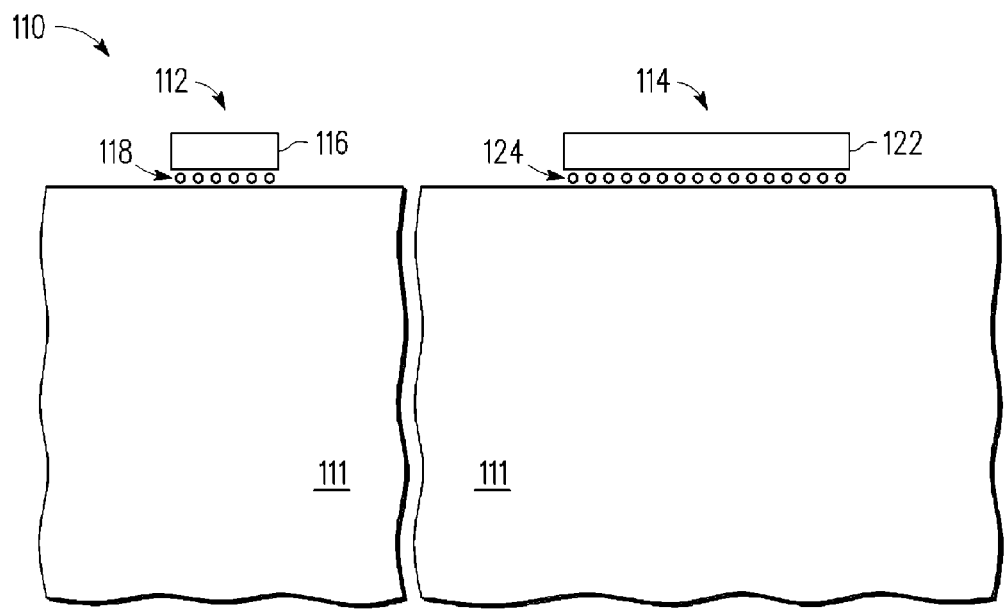
FIG. 5 shows a diagram of an exemplary memory bitcell for use with the exemplary non-volatile memory of FIG. 1.

FIG. 5 shows a diagram of an exemplary memory bitcell 110 for use with the exemplary non-volatile memory of FIG. 1. Memory bitcell 110 may include a substrate 111 having two transistors 112 and 114. Transistor 112 may have source/drain terminals (not shown) and a control gate 116. A storage layer, such as a nanocrystal layer 118 may be sandwiched between control gate 116 and a channel of transistor 112. Transistor 114 may have source/drain terminals (not shown) and a control gate 122. A storage layer, such as a nanocrystal layer 124 may be sandwiched between control gate 122 and a channel of transistor 114. In one embodiment, the channel width of transistor 114 may be greater than the channel width of transistor 112, as shown in FIG. 5. By way of example, transistor 112 may have a channel width of 0.28 μm and transistor 114 may have a channel width of 1.12 μm (effective width that is four times the width of transistor 112). Any of transistors 112 and 114 may be subjected to program/erase cycles. Transistors 112 and 114 may be programmed by adding electrons to the nanocrystal layer corresponding to each of transistors 112 and 114. Transistors 112 and 114 may be erased by removing electrons from the nanocrystal layer corresponding to each of transistors 112 and 114. In one embodiment, transistor 112 may be part of sector 0 13 of memory array 12, while transistor 114 may be part of another sector, such as sector 1 15 of memory array 12. This way, transistors 112 and 114, which have different levels of transconductance and fluence may be used in different parts of the non-volatile memory. By way of example, transistor 112 having a higher fluence may be used in areas of the non-volatile memory that receive more program/erase cycles than other areas of the non-volatile memory. On the other hand, transistor 114 having a lower fluence may be used in areas of the non-volatile memory that receive fewer program/erase cycles than the other areas of the non-volatile memory. In one embodiment, transistors 112 and 114 may be programmed separately. In one embodiment, transistors 112 and 114 may be erased simultaneously. Although FIG. 5 shows a specific implementation of a non-volatile memory bitcells, other implementations may also be used. In one embodiment, non-volatile memory cells may be split gate memory cells.

Figure 6:
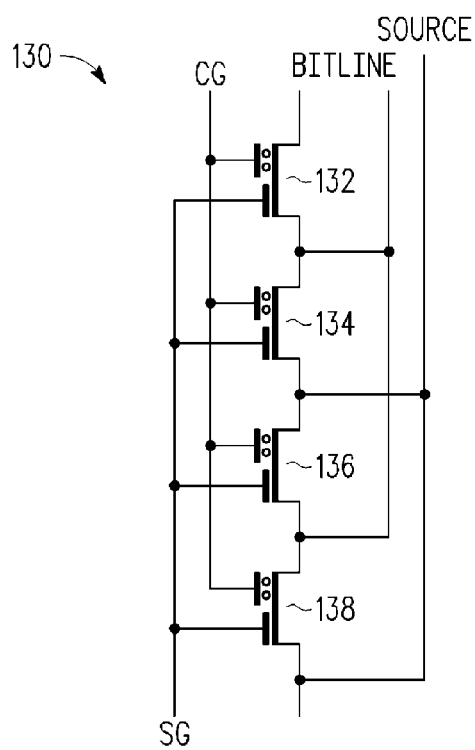
FIG. 6 shows a diagram of an exemplary bitline for use with the exemplary non-volatile memory of FIG. 1.

FIG. 6 shows a diagram of an exemplary bitline 130 for use with the exemplary non-volatile memory of FIG. 1. Bitline 130 may include transistors 132, 134, 136, and 138. The control gates of these transistors may be tied together to the control gate (CG) signal. The select gates of these transistors may be tied together to the select gate (SG) signal. The source terminals of these transistors may be tied together to SOURCE signal line. As shown in FIG. 6, the drains of these transistors may be permanently coupled to BITLINE. In operation, transistors 132, 134, 136, and 138 may be erased by applying a high positive voltage to the control gate (CG) of these transistors, with all the other terminals of these transistors grounded, causing electrons to tunnel from the memory storage element, such as a nanocrystal storage layer, through control gate. In addition, transistors 132, 134, 136, and 138 may be programmed by applying a high positive voltage to the control gate (CG) and source terminals of these transistors and applying a positive voltage to the select gate (SG) terminal. The conduction of current through non-volatile memory cells would result in electrons getting trapped into the memory storage element, such as the nanocrystal storage layer. Memory cells in a high-endurance sector and the ones in a non-high endurance sector may share bitline 130 or may have separate non-shared bitlines.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method, comprising:
performing a program/erase cycle on a first non-volatile memory (NVM) bit of an integrated circuit using a first fluence, wherein the first NVM bit has a first transconductance; and
performing a program/erase cycle on a second NVM bit of the integrated circuit using a second fluence, wherein the second NVM bit has a second transconductance, and wherein the first transconductance is greater than the second transconductance and the second fluence is greater than the first fluence, wherein the first NVM bit and the second NVM bit are coupled in parallel so that the threshold window for the first and second NVM bits is reduced 2. The method of claim 1, wherein the step of performing a program/erase cycle on the first NVM bit is further characterized by the first NVM bit comprising a plurality of NVM cells coupled in parallel for reading.

3. The method of claim 2, wherein the step of performing a program/erase cycle on the first NVM bit is further characterized by separately programming each of the plurality of NVM cells.

4. The method of claim 3, wherein the step of performing a program/erase cycle on the first NVM bit is further characterized by simultaneously erasing the plurality of NVM cells.

5. The method of claim 4, further comprising separately reading each NVM cell of the plurality of NVM cells.

6. The method of claim 2, wherein the step of performing the program/erase cycle on the first NVM bit is further characterized by the plurality of NVM cells comprising transistors having drains permanently connected together.

7. The method of claim 1, wherein
the step of performing a program/erase cycle on the first NVM bit is further characterized by the first NVM bit comprising a first transistor having a first channel width;
the step of performing a program/erase cycle on the second NVM bit is further characterized by the second NVM bit comprising a second transistor having a second channel width; and
the first channel width is greater than the second channel width.

8. The method of claim 7, wherein:
the step of performing a program/erase cycle on the first NVM bit is further characterized by the first transistor having a first nanocrystal storage layer; and
the step of performing a program/erase cycle on the second NVM bit is further characterized by the second transistor having a second nanocrystal storage layer.

9. The method of claim 8, wherein the step of performing a program/erase cycle on the first NVM bit is further characterized by removing electrons from the first nanocrystal layer to achieve erasure of the first NVM bit and adding electrons to the first nanocrystal layer to achieve programming of the first NVM bit.

10. The method of claim 1, wherein:
the step of performing a program/erase cycle on the first NVM bit is further characterized by the first NVM bit being in a first sector in a first memory array; and
the step of performing a program/erase cycle on the second NVM bit is further characterized by the second NVM bit being in a second sector in the first memory array.

11. A memory, comprising:
a first non-volatile memory (NVM) bit having a first transconductance;
a second NVM bit having a second transconductance less than the first transconductance; wherein the first NVM bit and the second NVM bit are coupled in parallel so that the threshold window for the first and second NVM bits is reduced; and
a program/erase circuit coupled to the first and second NVM bits that performs a program/erase cycle using a first fluence on the first NVM bit and a second fluence on the second NVM bit, wherein the first fluence is less than the second fluence.

12. The memory of claim 11, wherein the first NVM bit comprises a plurality of NVM cells coupled to a plurality of bit lines of a memory array, further comprising:
a column select circuit coupled to the plurality of bit lines; and
an address decoder coupled to the column select circuit that receives an address signal and couples the plurality of bit lines together in response to the address signal indicating that the first NVM bit is being selected.

13. The memory of claim 12, further comprising an address match circuit, coupled to the address decoder, that determines if the address decoder is to couple the plurality of bit lines together.

14. The memory of claim 13, further comprising a sense amplifier, wherein the address match circuit directs the column select circuit to couple only one of the plurality of bit lines to the sense amplifier in response to a configuration signal.

15. The memory of claim 12, wherein each of the plurality of NVM cells of the firat NVM bit have a first channel width and the second NVM bit comprises a transistor having the second channel width.

16. The memory of claim 11, wherein the first NVM bit is characterized as having less trap-up per program/erase cycle than the second NVM bit.

17. The memory of claim 11, wherein the first and second NVM bits comprise nanocrystals for charge storage.

18. The memory of claim 11, wherein the first NVM bit is in a first sector of a first memory array and the second NVM bit is in a second sector of the first memory array.

19. A memory, comprising:
a first non-volatile memory (NVM) bit having a first transconductance;
a second NVM bit having a second transconductance less than the first transconductance; wherein the first NVM bit and the second NVM bit are coupled in parallel so that the threshold window for the first and second NVM bits is reduced; and
means for performing an event on each of the first and second NVM bits wherein the event comprises one of a group consisting of program and erase and wherein the event causes more trap up in the second NVM bit than the first NVM bit.

20. The memory of claim 19, wherein the means for performing is for performing the erase in which electrons are removed from nanocrystals used for charge storage in the first and second NVM bits and more trap-up in the second NVM bit is caused by more fluence in erasing the second NVM than in erasing the first NVM bit.

* * * * *